(12) United States Patent
Kugler et al.

(10) Patent No.: US 8,988,654 B2
(45) Date of Patent: Mar. 24, 2015

(54) SUPPORT ELEMENTS FOR AN OPTICAL ELEMENT

(75) Inventors: Jens Kugler, Aalen (DE); Ulrich Weber, Ulm (DE); Nicolai Wengert, Auenwald (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 960 days.

(21) Appl. No.: 13/071,165

(22) Filed: Mar. 24, 2011

(65) Prior Publication Data

US 2012/0067833 A1    Mar. 22, 2012

Related U.S. Application Data

(63) Continuation of application No. PCT/EP2009/062686, filed on Sep. 30, 2009.

(60) Provisional application No. 61/114,540, filed on Nov. 14, 2008.

(30) Foreign Application Priority Data

Sep. 30, 2008    (DE) .......................... 10 2008 049 746

(51) Int. Cl.
*G02B 7/00* (2006.01)
*G03F 7/20* (2006.01)

(52) U.S. Cl.
CPC ............ *G02B 7/003* (2013.01); *G03F 7/70825* (2013.01)
USPC .......................................................... 355/53

(58) Field of Classification Search
CPC ............................ G03F 7/70825; G02B 7/003
USPC ...................................... 355/53; 359/811, 822
See application file for complete search history.

(56) References Cited

U.S. PATENT DOCUMENTS

| 6,402,329 B1 | 6/2002 | Bailly et al. |
| 6,859,337 B2 | 2/2005 | Oshino |
| 2007/0279768 A1 | 12/2007 | Shibazaki |
| 2009/0207511 A1* | 8/2009 | Schoeppach et al. ......... 359/822 |

FOREIGN PATENT DOCUMENTS

| CN | 1826547 A | 8/2006 |
| EP | 1 245 982 | 10/2002 |
| EP | 1 632 799 A1 | 3/2006 |
| JP | 2004-031491 | 1/2001 |
| JP | 2002-350699 | 12/2002 |
| KR | 10-2006-0021339 | 3/2006 |
| WO | WO 02/16993 | 2/2002 |

OTHER PUBLICATIONS

The International Search Report for the corresponding PCT Application No. PCT/EP2009/062686, mailed Feb. 24, 2010.

(Continued)

*Primary Examiner* — Peter B Kim
(74) *Attorney, Agent, or Firm* — Fish & Richardson P.C.

(57) ABSTRACT

Support elements for an optical element and a method for supporting an optical element are disclosed. The disclosure can be used in connection with arbitrary optical apparatuses or optical imaging methods. In particular, the disclosure can be used in connection with the microlithography employed in the manufacture of microelectronic circuits.

29 Claims, 12 Drawing Sheets

(56) References Cited

OTHER PUBLICATIONS

Korean Office Action, with English translation, issued in Korean Application No. 10-2011-7009951, dated Sep. 27, 2013.

Chinese Office Action, with English translation, issued in CN 200980147722.7 on Nov. 2, 2012.
Korean Office Action, with English translation, issued in Korean Application No. 10-2011-7009951.

* cited by examiner

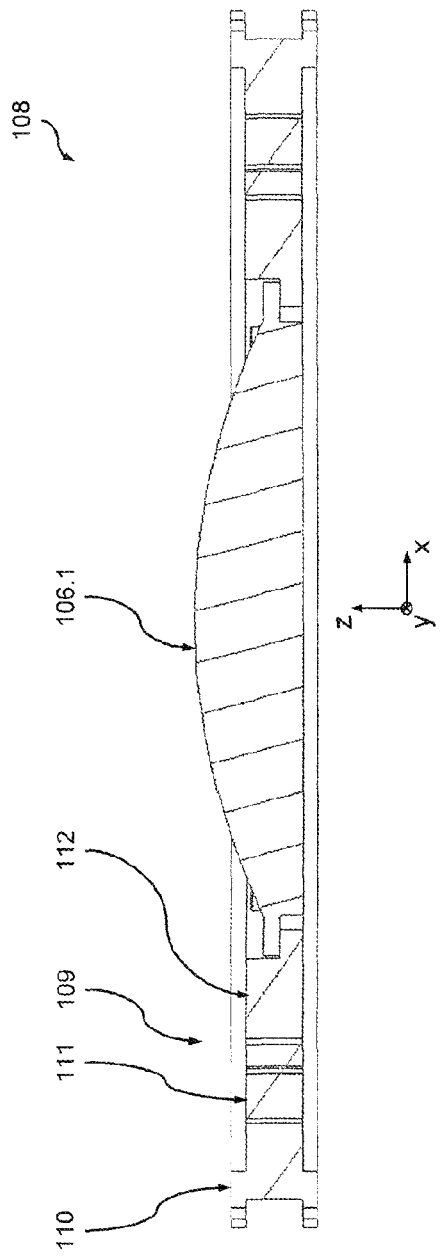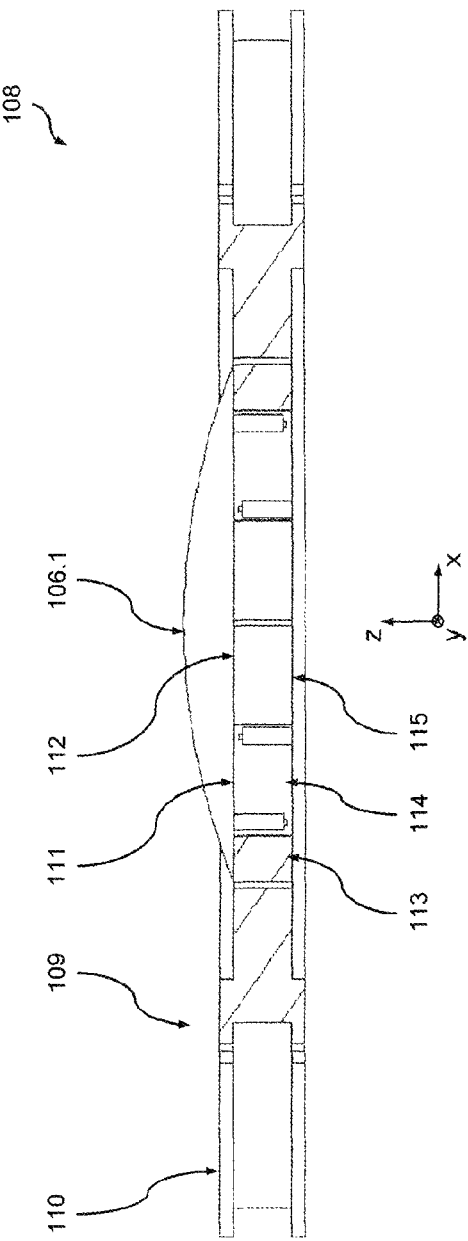
Fig. 3
Fig. 4

SUPPORT ELEMENTS FOR AN OPTICAL ELEMENT

CROSS-REFERENCE TO RELATED APPLICATIONS

This application is a continuation of, and claims benefit under 35 USC 120 to, international application PCT/EP2009/062686, filed Sep. 30, 2009, which claims benefit under 35 USC 119 of German Application No. 10 2008 049 746.0, filed Sep. 30, 2008 and under 35 USC 119(e) of U.S. Ser. No. 61/114,540, filed on Nov. 14, 2008. International application PCT/EP2009/062686 is hereby incorporated by reference in its entirety.

FIELD

The present disclosure relates to support elements for an optical element and a method for supporting an optical element. The disclosure can be used in connection with arbitrary optical apparatuses or optical imaging methods. In particular, the disclosure can be used in connection with the microlithography employed in the manufacture of microelectronic circuits.

BACKGROUND

In particular in the field of microlithography, apart from the use of components designed to have the highest possible precision it is, among other things, desirable during operation to set the position and orientation of optical modules of the imaging device, and thus for example the modules with optical elements such as lenses, mirrors and gratings but also the masks and substrates used, as accurately as possible within specified setpoint values, or to stabilise such components in a specified position or geometry, in order to achieve a correspondingly high imaging quality (wherein in the sense of the present disclosure the term optical module can mean both optical elements alone as well as assemblies of such optical elements and further components, such as for example holder parts, etc.).

To this end support structures are often used in which a plurality of support elements cooperate in a parallel kinematic fashion in order to position and orient the optical element in all six degrees of freedom. A typical example of such parallel kinematics is so-called hexapods, in which six support elements (usually in three pairings, or so-called bipods) position and orient the optical element in relation to a larger support unit in the form of a ring shaped retainer. Often for the support elements simple, leaf-spring-like elements are used here, as for example are known from WO 02/16993 A1 (Shibazaki), the full disclosure of which is incorporated herein by reference.

These configurations often have the disadvantage that perpendicular to the plane of the retainer they are comparatively high-rise so that the manipulators in a configuration of the optical system with optical elements close together generally have to be nested with each other, in order to guarantee the desired distance between the optical elements. This can bring along the further disadvantage that the optical elements can only be fitted to be rotated with respect to one another to a limited extent (for example around the optical axis of the system), so that it is frequently not possible to combine two or more optical elements in such a way that imaging errors (for example caused by deformation of the optics) of the optical elements can mutually compensate each other.

From EP 1 632 799 A1 (Shibazaki), the full disclosure of which is incorporated herein by reference, a hexapod structure with a low-rise in the direction of the optical axis is known, in which the optical element is supported by six support members, which in each case at both ends are joined to the adjacent components by a flexure acting in the form of a ball joint. Here adjustment of the optical element takes place in that the articulation point of the support member assigned to the external supporting structure is displaced tangentially to the circumferential direction of the optical element, so that the articulation point of the supporting body assigned to the optical element is inter alia displaced in the direction of the optical axis of the optical element.

As a result of the articulation used in the form of a ball-joint, while the desired adjusting kinematics are achieved in a small area, there is nevertheless a problem that the two flexures can have only a comparatively low cross-sectional area so that under just static loading, but above all under dynamic loading (with high accelerations), relatively high stresses in the bending elements can arise. The consequence of this is that, firstly, the lifetime of the manipulators of the optical elements can be limited or only comparatively low accelerations may be permitted and thus (for a specified adjusting range) only relatively small adjusting movements can be made. In view of the continuing trend towards increasing travel with greater adjusting ranges, this can be extremely disadvantageous.

A further disadvantage of this configuration can be that in the region of the ball joints possible tilting motions can lead to a falsification of the position of the articulation point assigned to the optical element in the direction of the optical axis and thus to reduced positioning accuracy.

SUMMARY

The present disclosure therefore provides a support element and a method for supporting an optical element which do not have the above disadvantages, or at least only to a limited extent, and in particular allow in a simple manner a high accuracy and high adjusting range in the positioning and orienting of the optical element for large adjusting movements (and thus high accelerations at the optical element) and with long lifetimes for the support element.

The present disclosure is based on the recognition that it is possible to achieve particularly high accuracy and a particularly high control bandwidth in the positioning and orienting of the optical element for large adjusting movements with long lifetimes of the support element, if the flexures of the support element are configured as bending elements elongated transversely to their bending axis. In this way in a simple fashion the cross-sectional area of the respective flexure is increased so that even at high dynamic loading comparatively moderate stresses arise.

This configuration also has the advantage that the flexures can be configured in such a way that the regions in which movements in the various degrees of freedom are permitted or limited, can be assigned clearly distinguishable regions of the support element and can be more easily captured. Thus for example the mobility of the support element in the region of the support member can in an advantageous manner be strongly limited to motions within a few degrees of freedom, while motion decoupling in the other degrees of freedom takes place at other locations of the support member. This makes the control concept less complex and allows an increase in accuracy in the positioning and orienting of the optical element.

According to a first aspect the present disclosure therefore relates to a support element for an optical element, in particular for microlithography, with a support member, a first connection element for connecting the support member to an external support unit and a second connection element for connecting the support member to the optical element. The support element is configured to cooperate with further support elements in a parallel kinematic fashion for positioning and orienting the optical element relative to the external support unit in six degrees of freedom.

The support member includes a plurality of first flexures, with the first connection element and/or the second connection element including at least a second flexure, wherein each of the first and second flexures defines a bending axis. A motion restriction of the optical element relative to the support unit can be accomplished in at most two degrees of freedom by way of the plurality of first and second flexures. Each of the first and second flexures is configured in elongated fashion along the bending axis.

According to a further aspect the present disclosure relates to a support element for an optical element, in particular for microlithography, with a support member, a first connection element for connecting the support member to an external support unit and a second connection element for connecting the support member to the optical element, wherein the support element is configured to cooperate with further support elements in a parallel kinematic fashion for positioning and orienting the optical element relative to the external support unit in six degrees of freedom. The first connection element is configured to exert on the support member at a first connection region to the first connection element a displacement in a first direction, in order to generate a displacement of a second connection region of the second connection element to the support member in a second direction. The support member includes a plurality of first flexures, while the first connection element and/or the second connection element has at least one second flexure. The first flexures are configured and arranged so that they prevent a rotation of the second connection region in relation to the first connection region around an axis of rotation which lies in a plane of motion defined by the first direction and the second direction.

According to a further aspect the present disclosure relates to an optical module, in particular for microlithography, with an optical element, a plurality of support elements and an external support unit, wherein the plurality of support elements position and orient the optical element in a parallel kinematic fashion in relation to the external support unit in six degrees of freedom. At least one of the plurality of support elements is a support element according to the disclosure.

According to a further aspect of the disclosure the disclosure relates to an optical module with a support unit, at least one bipod for holding and/or positioning an optical element of a microlithographic projection exposure system relative to the support unit, wherein the bipod includes two bipod braces each of which with the first end, the brace foot, is directly or indirectly connected to the support unit, and each of which with the second end, the brace head, is directly or indirectly connected to an optical element in such a way that at least one brace head with a connecting line connecting the two brace feet spans a bipod plane. Here, the spacing of the brace feet along the connecting line may optionally be greater than the spacing of the brace heads. Alternatively the spacing of the brace feet along the connecting line can be smaller or the same as the spacing of the brace heads. Further, the spacing of the brace feet can be adjusted by at least one lever retained on a bearing and engaging via a connection unit with at least one brace foot, moveable in at least one direction of motion, wherein at least one direction of motion of the lever is outside of the bipod plane, and wherein the connection unit has at least one flexure with precisely one bending plane so that the flexure has a rigid configuration perpendicularly to the bending plane.

According to a further aspect the present disclosure relates to an optical imaging device, in particular for microlithography, with an illumination device, a mask device to accommodate a mask including a projection pattern, a projection device with an optical element group and a substrate device to accommodate a substrate. The lighting device is configured to illuminate the projection pattern, whereas the optical element group is configured to project the projection pattern on the substrate. The lighting device and/or the projection device includes an optical module according to the disclosure.

According to a further aspect the present disclosure relates to a method for supporting an optical element, in particular for microlithography, in which the optical element is supported via a plurality of support elements on an external support unit and is positioned and oriented in a parallel kinematic fashion in relation to the external support unit in six degrees of freedom, wherein a support element has a support member which via a first connection element is connected to the external support unit and via a second connection element is connected to the optical element. The support member includes a plurality of first flexures, while the first connection element and/or the second connection element has at least one second flexure, wherein each of the first and second flexures defines a bending axis. Via the plurality of first and second flexures a motion restriction of the optical element relative to the support unit can be accomplished in at most two degrees of freedom, wherein for each of the first and second flexures a joint is used which is configured in elongated fashion along the bending axis.

According to a further aspect the present disclosure finally relates to a method for supporting an optical element, in particular for microlithography, in which the optical element is supported via a plurality of support elements on an external support unit and is positioned and oriented in a parallel kinematic fashion in relation to the external support unit in six degrees of freedom, wherein a support element has a support member which via a first connection element is connected to the external support unit and via a second connection element is connected to the optical element. The first connection element exerts on the support member at a first connection region to the first connection element a displacement in a first direction, in order to generate a displacement of a second connection region of the second connection element to the support member in a second direction. The support member includes a plurality of first flexures, while the first connection element and/or the second connection element has at least one second flexure. Via the first flexures a rotation is prevented of the second connection region in relation to the first connection region around an axis of rotation lying in a plane of motion defined by the first direction and the second direction.

Further preferred designs of the disclosure become apparent from the dependent claims or the following description of preferred embodiments which refers to the attached drawings.

BRIEF DESCRIPTION OF THE DRAWINGS

FIG. 3 is a schematic cross-sectional view of the optical module of FIG. 2 (along line III-III of FIG. 2);

FIG. 4 is a schematic cross-sectional view of the optical module of FIG. 2 (along line IV-IV of FIG. 2);

DETAILED DESCRIPTION OF THE DISCLOSURE

First Embodiment

By reference to FIGS. 1 to 8 in the following a preferred embodiment of the optical support element according to the disclosure is described, which is used in an optical module according to the disclosure of an optical imaging device according to the disclosure for microlithography. In doing so, to simplify the following description an xyz system of coordinates is introduced in which the z direction denotes the vertical direction.

It is self-evident, however, that with other variants of the disclosure any other spatial alignment of the components of the imaging device can be provided for.

Figure 1:
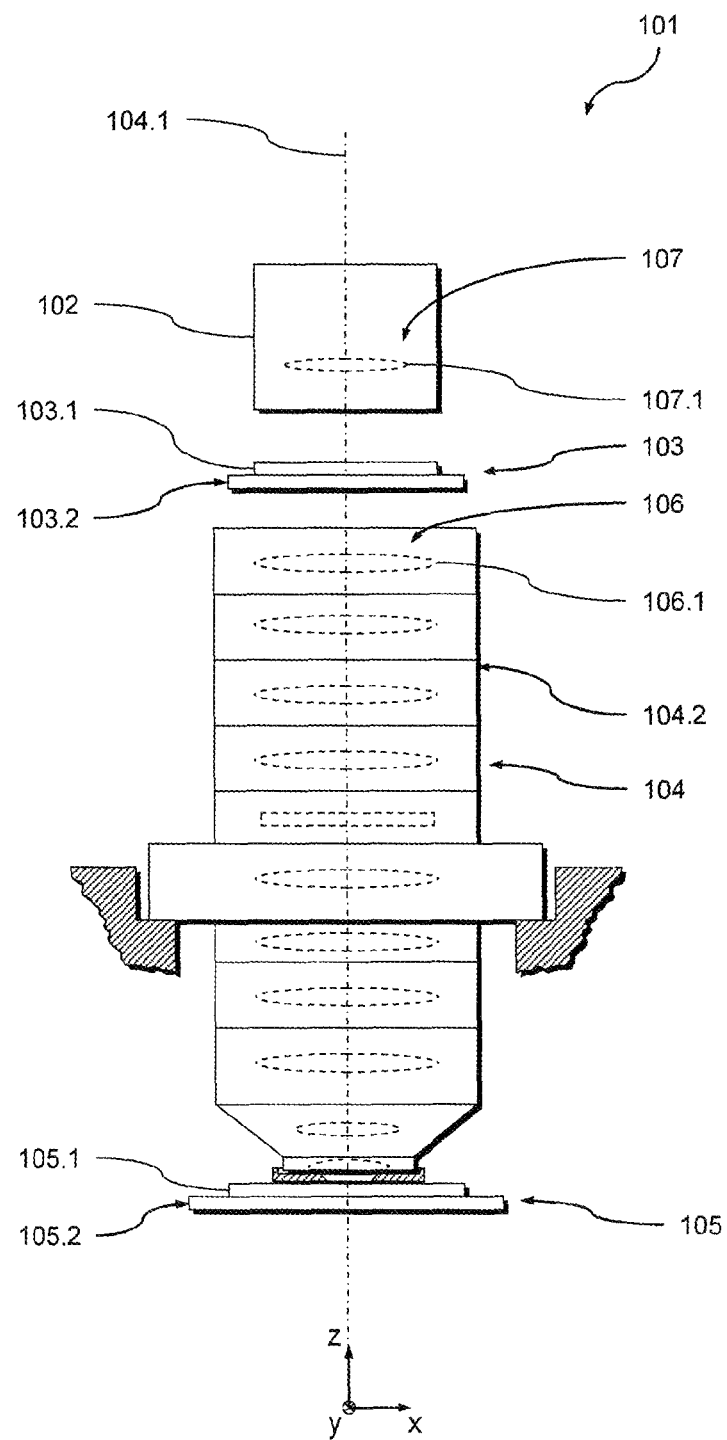
FIG. 1 is a schematic view of a preferred embodiment of the optical imaging device according to the disclosure, including an optical module according to the disclosure with a support element according to the disclosure and with which a preferred embodiment of a method according to the disclosure for supporting an optical element can be carried out.

FIG. 1 shows a schematic view of a preferred embodiment of the optical imaging device according to the disclosure in the form of a microlithography apparatus 101, which works with UV light having a wavelength of 193 nm.

The optical elements of the optical element groups are in this example refractive optical elements in the form of lenses, prisms, plates or similar. It is self-evident, however, that with other variants of the disclosure in each case refractive, reflective and/or diffractive optical elements can be used alone or in arbitrary combination.

The microlithography apparatus 101 includes an illumination system 102, a mask apparatus 103, an optical projection system in the form of an objective 104 and a substrate apparatus 105. The illumination system 102 illuminates a mask 103.1 arranged on a mask table 103.2 of the mask apparatus 103 with a projection light beam (not shown in more detail). On the mask 103.1 there is a projection pattern which with the projection light beam via the optical elements of an optical element group 106 arranged in the objective 104 is projected onto a substrate in the form of a wafer 105.1, arranged on a wafer table 105.2 of the substrate apparatus 105.

The illumination system 102 includes, in addition to a light source 102.1 inter alia a further optical element group 107 via which the projection light beam is formed and guided. As will be explained in the following by way of example using the optical element 106.1 of the optical element group 106, individual or all optical elements of the optical element groups 106 and 107 are retained in an optical module 108 according to the disclosure.

Figure 2:
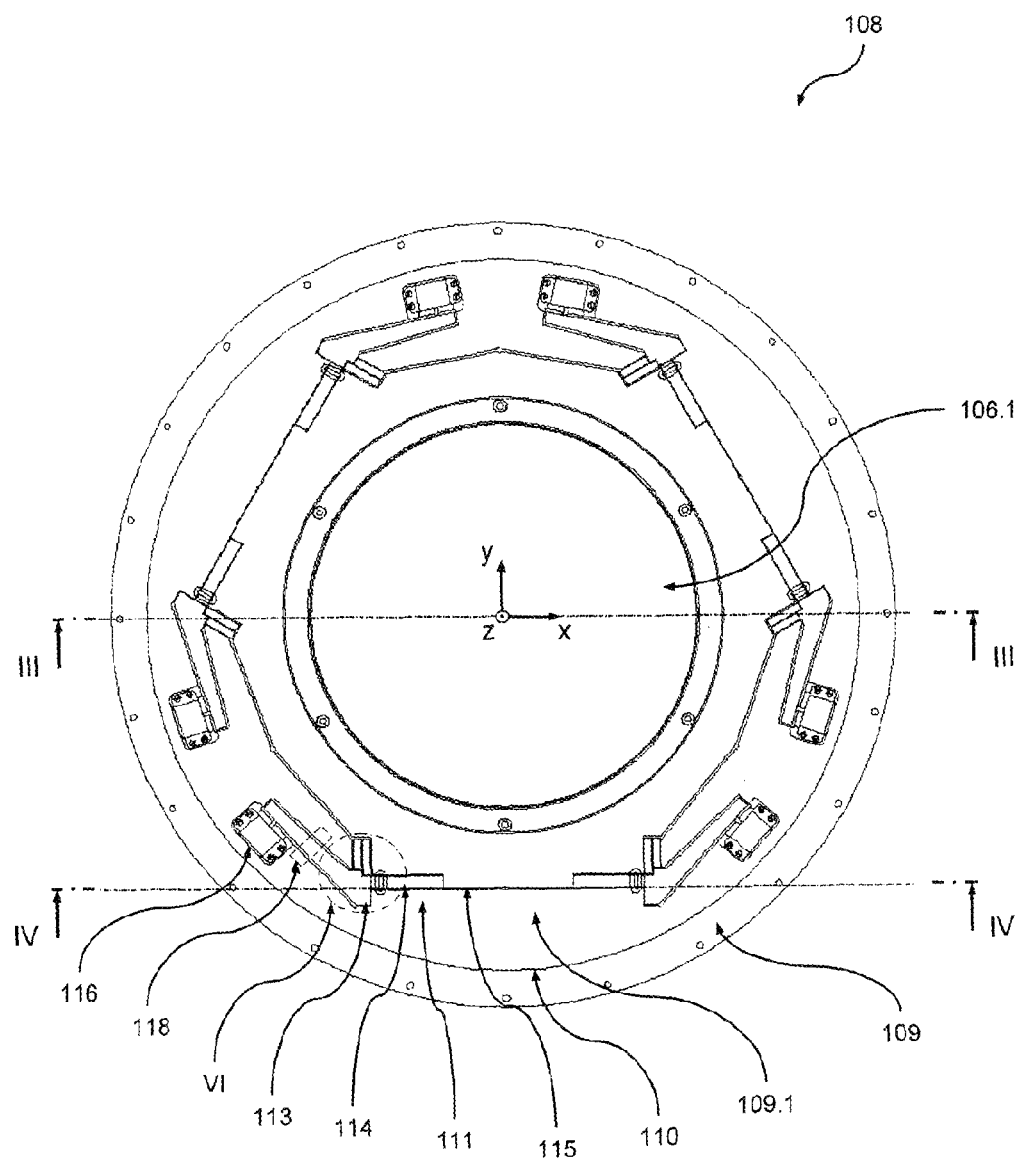
FIG. 2 is a schematic top view of a preferred embodiment of an optical module according to the disclosure of the imaging device of FIG. 1.

As can be inferred from FIGS. 2 to 4 in particular, the optical module 108 includes apart from the optical element 106.1 a retaining device 109 for the optical element 106.1 or for the optical assembly 106 made from a number of components, which is mechanically connected to the objective housing or possibly forms part of the objective housing, and thus the weight and the static and dynamic loads acting on the optical element 106.1 or the optical assembly 106 are taken up by a floor or basic structure.

The retaining device 109 includes an external support unit in the form of an external ring 110, which is connected via a plurality of support elements 111 according to the disclosure with an internal support unit in the form of an internal ring 112.

The external ring 110, the support elements 111 and the internal ring 112 are in the present example monolithically joined together. For this purpose they may for example be manufactured by wire erosion and if desired further machining processes from a solid block. It is self-evident, however, that with other variants of the disclosure other retaining devices can be used made from a number of assembled components (using any suitable assembly method).

The retaining device 109 in the present example includes six support elements 111, which in each case are grouped in pairs as bipods 109.1. The three bipods 109.1 formed in this way are distributed in the circumferential direction U evenly on the periphery of the optical element 106.1, so that a support structure configured in a parallel kinematic fashion in the form of a hexapod results, with which a statically determined support of the optical element 106.1 is achieved. Here the bipods 109.1 are (in a neutral position) in each case arranged symmetrically to a radial plane defined by the optical element 106.1, which contains the optical axis (z direction) and the radial direction R in each case defined by the optical element 106.1.

The support elements 111 are configured in such a way that they can adjustably (actively and/or passively) position and orient, respectively, in all six degrees of freedom in space the optical element 106.1 secured in any conventional manner (not described in more detail here) to the internal ring 112. To this end each support element 111 has a first connection element in the form of a lever 113 connected to the external ring 110. The lever 113 is in a first connection region connected with one end of a support member 114, which at its other end is connected in a second connection region with a second connecting element 115. The second connecting region 115 is in turn connected with the internal ring 112.

Generally the optical module 108 in the executions according to this document includes a support unit 110, preferably an external support unit, such as for example an external ring 110. The optical module 108 further includes at least one bipod 109.1 for retaining and/or positioning an optical element 106.1 of a microlithographic projection exposure system 101 relative to the support unit 110, wherein the bipod 109.1 includes two bipod braces, also referred to as support members 114, each of which with the first end, the brace foot, is directly or indirectly connected to the support unit 110, and each of which with the second end, the brace head, is directly or indirectly connected to an optical element 106.1. The connections of the brace heads and brace feet are such that at least one brace head with a connecting line connecting the two brace feet spans a bipod plane, wherein the spacing of the brace feet along the connecting line is greater than the spacing of the brace heads and wherein the spacing of the brace feet can be adjusted by at least one lever 113 retained on a bearing (113.1 in FIG. 6) and engaging via a connection unit with at least one brace foot, moveable in at least one direction of motion. Here at least one direction of motion of the lever is outside of the bipod plane. Further, the joint unit has at least one flexure (e.g. 114.1, 114.2 in FIG. 5) with precisely one bending plane so that the flexure has a rigid configuration perpendicularly to the bending plane.

Alternatively the spacing of the brace feet along the connecting line can be smaller than or equal to the spacing of the brace heads. Generally the spacings and the points of intersection of the bipod braces defined by these, or the points of intersection of the lines along the bipod braces, define the location of the tilting axes, around which a tilting (rotation) of a platform (or a member) takes place if a plurality of bipod elements in a parallel kinematic fashion (e.g. in the form of hexapod) act on a spatially aligned platform or on a member.

With the described general embodiment of the optical module 108, by way of example a bipod brace of a bipod can be directly connected to an external ring (or the support unit), whereas the second bipod brace of the bipod, as described above, is indirectly connected with the external ring 110 e.g. via the lever 113. Alternatively both bipod braces can be connected indirectly, e.g. via respective levers 113 (or generally via actuators) with the external ring (with a support unit 110). Here it is advantageous if, when changing the spacing of the brace feet and/or changing the position of the brace feet relative to the support unit 110, the brace heads of the bipod are able to move dependent upon the position of the brace feet in a number of directions. This opens up the possibility of an optical element articulated directly or indirectly to the brace heads in a plurality of degrees of freedom. Here the number of degrees of freedom is also dependent upon the further mounting elements retaining the optical element. Preferably the optical module 108 includes three bipods which, as described above, form a hexapod. In this case the optical module 108 includes three preferably in each case identically configured bipods corresponding to the at least one bipod, which in order to retain and/or position the optical element relative to the support unit form a hexapod structure, wherein each bipod corresponding to the at least one bipod in each case is assigned a corresponding lever and connection units. The parallel kinematics formed by the hexapod, in which the optical element can be positioned extensively free from constraining forces in up to 6 degrees of freedom, has the advantage that all actuators (levers) act directly on the same moving platform. Here the platform is the unit or module which is connected with the brace heads of the bipods. This can, for example, be the optical element itself (for direct connection of the brace heads of the bipod braces), or for example an internal retaining ring for the optical element which can also include the connection elements described in more detail below.

One of the advantages of parallel kinematics is that these have a lower mass than serial kinematics, in which each actuator acts on its own adjusting platform with in each case an additional mass. Through the lower overall mass of the parallel kinematics for the latter a natural frequency spectrum advantageously results, the lowest natural frequency of which is normally markedly higher than the lowest natural frequency in serial kinematics, since the latter, in a first approximation, scale to the square root of the reciprocal of the mass. Through the higher natural frequency excitation of vibration of the optical module is prevented. This can be important in optical modules like those used in a microlithographic projection exposure system, since otherwise the high optical resolution cannot be achieved. Due to the lower mass the parallel kinematics also have better dynamic characteristics than serial kinematics. A further advantage of parallel kinematics is that no moving electrical lines are necessary, so that the risk of constraining forces from cables does not arise. Further, parallel kinematics can be built to be flatter and more compact than serial kinematics. This can also be of importance in a microlithographic projection exposure system, since here the optical elements are often arranged very close to one another, especially if optical elements with expensive free-formed surfaces as the refractive and/or reflective surfaces are dispensed with. A further very important aspect in precision optics, as used in microlithographic projection exposure systems, is that in parallel kinematics, such as for example in the hexapod, no additional guidance errors arise as they do with serial kinematics. Thus with parallel kinematics the maximum positional accuracy for the optical element in the optical module 108 is achieved.

In the described general embodiment of the optical module 108, further, as mentioned, the head of one bipod brace can engage directly with an optical element. Alternatively the brace head engages indirectly with the optical elements, wherein between the brace head and the optical element a connecting element 115 described in more detail below can be provided, or wherein the optical element can also be held in a retainer, e.g. an internal retaining ring. Normally, but not necessarily, the two brace heads of a bipod engage in the same way with the optical element, in particular if the optical element is held in the optical module by a hexapod.

Because in the general execution of the optical module 108 at least one direction of movement of the lever is located outside of the bipod plane, the module 108 can be configured to be flatter and thus more compact in the direction perpendicular to the connecting line of the brace feet. As a result the advantage of the compact configuration of parallel kinematics, such as for example the hexapod, is further optimised. The most compact construction is achieved if the direction of motion of the lever is perpendicular to the bipod plane, since then the motion of the lever in the direction perpendicular to the connecting line between the brace feet does not require any space.

In order that the spacing of the brace feet in the general execution of the optical module 108 is variable or can be adjusted, at least one brace foot is connected via a joint unit with the moving lever. This is because, inter alia, the change in spacing of the brace feet brings about a change in the angle between the bipod brace moved by the lever and the lever itself, for the bipod braces usually have a rigid configuration, i.e. their length in good approximation does not change. Here the joint unit includes at least a first flexure. In order to take full advantage of parallel kinematics formed by the optical module 108 in terms of positional accuracy when flexures are used, such as for example solid state joints, the flexure has precisely one bending plane. This prevents parasitic bending of the flexure in a direction that deviates from the bending plane displacing the brace foot engaging with the joint unit in an undesired parasitic direction. The latter would result in the associated brace head of the bipod also performing an undesired parasitic motion, thereby impairing the positional accuracy. In order for the flexure to have precisely one bending plane in directions outside the bending plane, e.g. in the direction perpendicular to the bending plane, it has a rigid configuration.

The relative term "rigid" means that the flexure in the direction of the bending plane has a first moment of resistance and perpendicular to the bending plane a second moment of resistance, wherein the second moment of resistance is at least double the size of the first moment of resistance. Moment of resistance in the direction of a bending plane means the moment of resistance which when the flexure is under bending stress is decisive in the direction of the bending plane. Similarly the second moment of resistance means that which, when a flexure is under bending stress, is decisive in the direction perpendicular to the bending plane. Generally, the higher the second moment of resistance, the more rigid the configuration of the flexure in the direction perpendicular to the bending plane. This consideration applies in general for any direction and is not restricted to the direction perpendicular to the bending plane. Depending on the desired positional accuracy of the optical element and the geometry of the bipod, in particular the length of the bipod braces and their coupling to the optical element with due regard to any further flexures, it may be desirable to satisfy high rigidity properties. Thus it may be desirable for the second moment of resistance to be at least 5 times greater or at least 10 times greater than the first moment of resistance.

Here the moment of resistance means the quotient of the axial second moment of area (or area moment of inertia) and the largest distance between an extreme fibre and the neutral fibre of the flexure. The moment of resistance provides the maximum stress loading for a given bending stress (for a given bending moment) as the quotient of the bending moment and the moment of resistance. In order to also take into account any maximum tangential stresses under torsional strains, the polar moment of resistance, or also called the torsional moment of resistance, takes the place of the moment of resistance.

In order to meet the above rigidity properties in a direction deviating from the bending plane, e.g. perpendicular thereto, it is often sufficient if the flexure has an elongated bending axis perpendicular to the bending plane, and here the length of the flexure in the direction of the bending axis is at least double a maximum cross-sectional dimension of the at least one flexure of the bending unit running perpendicularly to the bending axis in the bending direction. If, for example, the flexure is configured as a leaf-spring-like joint with a square section perpendicular to the bending plane, then this condition is not met. If, on the other hand, the flexure is provided with a rectangular section perpendicular to the bending plane, wherein the long side of the sectional rectangle is perpendicular to the bending plane, then the condition is met if the sectional rectangle has a ratio of edge lengths of two.

The respective support member 114 (which forms a bipod brace) in the present example of FIGS. 2 to 4 extends approximately parallel to the associated tangential direction T (which is defined by the tangent to the optical element 106.1 at the location of the radial plane assigned to the respective bipod 109.1). In this execution each support member 114 has four first flexures 114.1 to 114.4 (FIG. 5), which each define a first bending axis. Here the bending axes of the flexures 114.1 and 114.3 or 114.2 and 114.4 run parallel to one another in pairs, while the bending axes of the two pairs 114.1, 114.3 and 114.2, 114.4 run transversely (to be more precise here perpendicularly) to one another.

Figure 5:
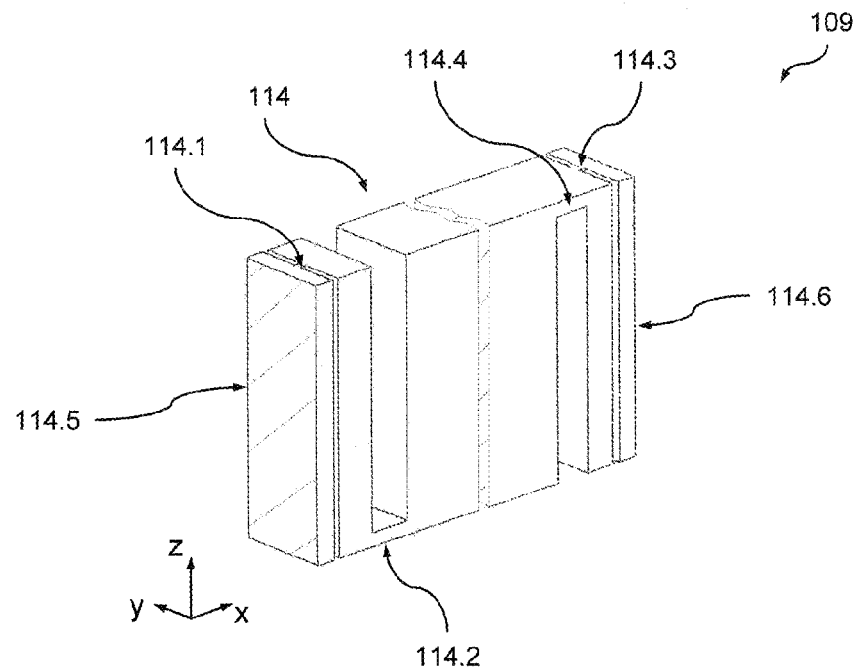
FIG. 5 is a schematic perspective cross-sectional view of part of a preferred embodiment of the support element according to the disclosure, which is used in the optical module of FIG. 2.

As FIG. 5 shows and describes, the joint unit of the general execution of the optical module 108 can include a further flexure 114.2 with a further bending plane which is approximately perpendicular to the bending plane of the at least one flexure 114.1. The further flexure 114.2 preferably has a further bending axis perpendicular to the further bending plane. Thus the brace foot 114 of the bipod 109.1 connected to lever 113 by the joint unit is supported by the flexures that are crossed in terms of their axes of rotation, as a result of which the brace foot and thus the associate bipod brace is decoupled in two degrees of freedom. With a suitable arrangement of the crossed flexures via these a ball joint can be approximated to, in particular if the spacing of the crossed axes of rotation is in the range of the extension of a flexure perpendicularly to the bending axis or even smaller.

In order to take full advantage of the parallel kinematics provided by the optical module 108 concerning positional accuracy in the use of flexures, such as for example solid state joints, the further flexure 114.2 perpendicular to the further bending plane preferably also has a rigid configuration. Here the further flexure in the direction of the further bending plane has a first moment of resistance and perpendicular to the further bending plane a second moment of resistance, wherein the second moment of resistance is at least double the size of the first moment of resistance. The explanation provided above in connection with the at least one flexure concerning its rigidity applies by analogy to the further flexure.

In order to also achieve the smallest possible parasitic motion of the brace foot connected to the flexure in the event of any torsional stresses on the bipod brace 114, which may result in torsion of the flexure, the further flexure 114.2 in relation to a torsional axis perpendicular to the further bending axis is configured such that the polar moment of resistance in relation to this torsional axis is at least double the moment of resistance in the direction of the further bending plane.

In the general execution of the optical module 108 this can be configured so that the bending plane of the at least one flexure of the joint unit is parallel to a plane of symmetry of the optical element or parallel to a plane perpendicular to an optical axis within the projection exposure system. In this case the bending axis of the flexure extends parallel to the optical axis. In the executions according to FIGS. 2 to 5 such a flexure corresponds to the joint 114.1. If the execution includes the optical module with a joint unit with a further flexure, then the further bending plane of the further flexure is preferably perpendicular to a plane of symmetry of the optical element, or the further bending plane is parallel to an optical axis within the projection exposure system. Such a further flexure is, in the executions according to FIGS. 2 to 4, the joint 114.2. Here the further bending plane of the further flexure is parallel to the bipod plane in particular if the optical module 108 forms a hexapod structure as described above.

Figure 6:
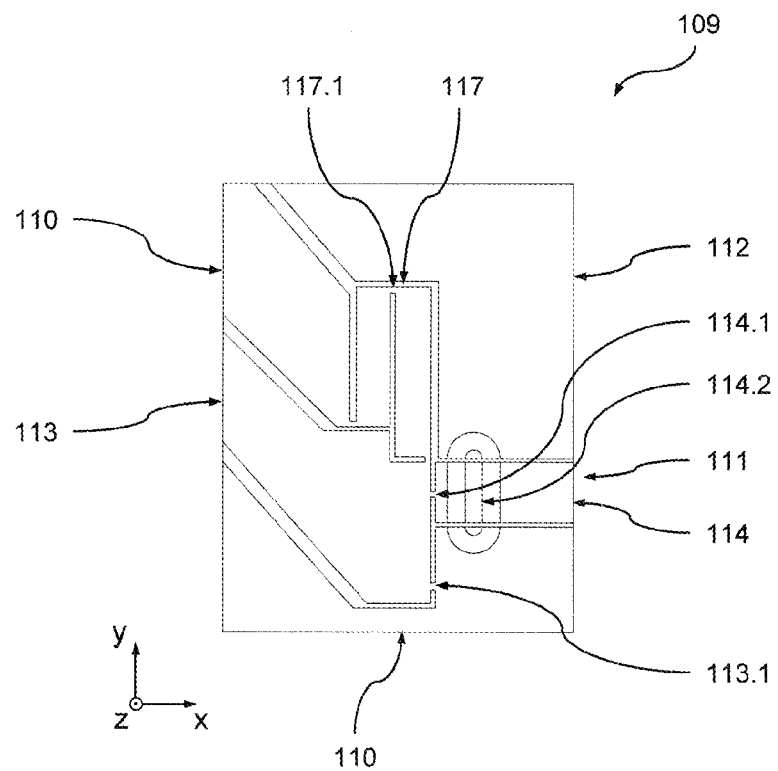
FIG. 6 is a schematic top view of a further part of the support element of FIG. 5.

FIG. 6 shows that the lever 113 in each case associated with the support member 114 is connected to the external ring 110 via a second flexure 113.1. The second flexure 113.1 defines a second bending axis and thus an axis of rotation of the lever 113, which (in the neutral position of the retaining device 109) runs parallel to the optical axis of the optical element 106.1.

With such a location of the flexure 113.1 in the optical module 108, the direction of motion of the lever is perpendicular to the bipod plane if the bipod plane runs parallel to the optical axis. Generally, independently of an optical axis, the direction of motion of the lever can be perpendicular to the bipod plane. Here the bending plane of the at least one flexure 114.1 is then perpendicular to the bipod plane. The bending axis of the at least one flexure 114.1 is then parallel to the bipod plane.

The lever 113 can be rotated by an adjusting device 116 (explained in more detail in the following) around an axis of rotation defined by the flexure 113.1. Here the first connection region 114.5 of the support member 114 experiences a displacement in the associated tangential direction T (x direction). This motion is converted by the arrangement of the first flexures 114.2 and 114.4 displaced in the direction of the optical axis of the optical element 106.1 and the abutment force of the further support element 111 assigned in the bipod 109.1 into a motion of the second connection region 114.6, which at least partly runs in the direction of the optical axis of the optical element 106.1 (z direction).

In an optical module according to the embodiments described here the at least one flexure 114.1 or the further flexure 114.2 of the joint unit is configured as a leaf spring, as shown in FIG. 5. Further, the bearing of the lever 113 assigned to the respective bipod 109.1 can be configured as a flexure 113.1, which joins the lever 113 to the support unit 110.

Here the respective first flexure 114.1 to 114.4, and the respective second flexure 113.1, is configured such that, in contrast to EP 1 632 799 A1 (Shibazaki) cited initially, it is has an elongated configuration along its bending axis. This has the advantage that the cross-sectional area of the flexure 114.1 to 114.4 or 113.1 is enlarged, so that in operation even under high dynamic loads at the respective flexure 114.1 to 114.4, 113.1 only moderate stresses within the flexure 114.1 to 114.4, 113.1 arise.

Compared to the prior art configurations in the case of an active positioning/orienting of the optical element 106.1 this offers the advantage that because of the lower stresses in the joints 114.1 to 114.4, 113.1 greater accelerations are permitted and thus for a specified control bandwidth of the displacement of the optical element 106.1 larger adjusting movements can be made, without this leading to a (possibly long-term) overloading of the flexure 114.1 to 114.4 or 113.1.

A further advantage of this configuration is that the motions in the individual degrees of freedom are assigned to clearly distinguished flexures. This simplifies any envisaged capture of the adjusting motions at the respective support element.

Finally the short configuration transverse to its bending axis of the second flexure 113.1, thus its configuration as a pure rotating joint, has the advantage that at most only a very slight tilting of the lever 113 around an axis transverse to the bending axis of the second flexure 113.1 can occur. This has considerable effects on the accuracy of the position and orientation of the optical element 106.1 and on the stability of the position and orientation of the optical element 106.1 under dynamic loads, since such tilting as a cause for a deviation from the desired position is then eliminated.

In order to reduce such tiltings the flexure 113.1 configuring the bearing for the lever 113 can have precisely one bending plane, so that the flexure of the bearing has a rigid configuration perpendicular to its bending plane. This execution is in particular preferred in the embodiments described here of the optical module 108 because of the advantages described above. Here also the term "rigid" means that the flexure of the bearing in the direction of its bending plane has a first moment of resistance and perpendicular to its bending plane a second moment of resistance, wherein the second moment of resistance is at least double the size of the first moment of resistance. It is often sufficient in order to achieve the rigidity for the flexure of the bearing to have an elongated bending axis perpendicular to its bending plane, wherein the length of the flexure of the bearing in the direction of its bending axis is at least double a maximum cross-sectional dimension of the flexure of the bearing running perpendicularly to the bending axis of the bearing in the bending direction. With the optical modules 108 according to the embodiments described here the bending axis 113.1 of the bearing can be parallel to the bipod plane the bipod of which can be adjusted with the lever 113.1 retained by the bearing.

In order to further reduce the extent of the tilting described, the respective lever 113 in the present example is connected via a flexure device 117 acting as a support joint to the external ring. The flexure device 117 is configured as a substantially U-shaped support arm (in the xy plane) with three further second flexures 117.1, the bending axes of which in each case run parallel to the bending axis of the second flexure 113.1. By this approach it can follow the rotational motion of the lever 113 and at the same time serve as a support against the tilting of the lever 113 described above.

The support arm 117 is with regard to the first connection region 114.5 arranged opposite the second flexure 113.1, as a result of which particularly good support against tilting of the lever can be achieved. It is self-evident, however, that the support against tilting of the lever can be arranged at any other suitable point.

If especially good support against tilting is to be achieved, it can if desirable also be provided that the (virtually freely overhanging) part of the external ring 110, on which the support arm 117 is arranged, is joined, via a reinforcing (for example screwed) support plate, with the part of the external ring 110 located on the other side of the lever 113, as shown in FIG. 2 by the dashed contour 118.

It is also self-evident that the additional support against tilting of the lever in other variants of the disclosure can also be configured in another way. If desired, however, it can also be completely omitted where the second flexure guarantees sufficient support at the expected static and dynamic loads.

In order to reduce the tilting of the lever 113 described above in the described embodiments of the optical module 108 the lever can have at least one further flexure with which the support unit 110 is connected. Here it is advantageous if the further flexure of the lever has precisely one bending plane which is parallel to the bending plane of the flexure 113.1 of the bearing. Additionally, the further flexure of the lever preferably also has a rigid configuration perpendicular to its bending plane. It is also advantageous if the further flexure is arranged at a distance from the bearing which is smaller than double the length of the load arm of the lever. As a result with the normally high deflection ratios of force to load arm, often of more than 5, through the further flexure supporting the lever only a relatively small motion compensation at the further flexure is desirable, for which reason this further flexure can likewise have a rigid configuration. Generally the lever can be configured as a single-sided or double-sided lever. Alternatively or additionally to reduce the tilting the lever can be joined via a flexure 914.1 to the bipod brace 914, in particular if this is in turn supported by the support unit 110 via a flexure 913.2 (see FIG. 16).

Figure 7:
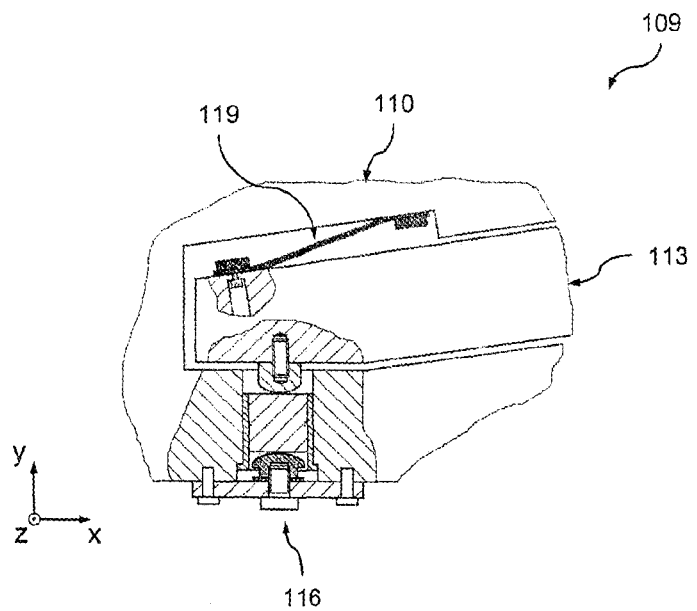
FIG. 7 is a schematic top view of a further part of the support element of FIG. 5.

As can be inferred in particular from FIG. 7, the lever 113 at its free end turned away from the support body 113 is connected to an adjusting device 116, via which the rotation of the lever 113 around its axis of rotation can be set. In the example shown it is a generally known passive device by which by various mechanisms (screw connections and adjusting washers) rough and fine adjustment of the rotation of the lever can take place. It is self-evident here that in addition to or instead of this passive adjusting device as mentioned an active adjusting device (working according to arbitrary operating principles or combinations of operating principles) can be provided.

Particularly advantageous in the present configuration, however, and unlike the known configurations (e.g. from EP 1 632 799 A1 mentioned initially), is the incorporation of a pre-tensioning device 119 for the lever 113 in the swivel plane of the lever 113. The pre-tensioning device 119 is configured here as a simple leaf spring, which is incorporated in the gap between the external ring 110 and the lever 113. This has the advantage that through the pre-tensioning force no additional tilting moment is exerted on the lever 113. In addition the leaf spring 119 itself (because of its high rigidity in is extension plane) can still act as a tilting support of the lever 113 or endorse the latter.

In further embodiments of the optical modules 108 described here the lever can include a pre-tensioning device and an adjusting device, e.g. as described above.

As can be inferred in particular from FIG. 5, in the present example, the first flexures 114.1 and 114.3, transverse to their bending axis, are configured to be short and thus pure rotating joints, while the two first flexures 114.2 and 114.4, also transverse to their bending axis, are configured as elongated leaf spring elements. This configuration means that the two first flexures 114.2 and 114.4 can also take up a torsion around an axis (here: the x axis) transversely to their bending axis.

In this way for example a tilting of the optical element 106.1 around an axis running transversely to its optical axis can be compensated by the support elements 111. Accordingly in the present example the support member 114 causes a restriction of the motion of the optical element 106.1 in relation to the external ring in precisely one degree of freedom (namely the translation in the x direction).

It is self-evident, however, that with certain variants of the disclosure (for example for a purely translational adjustment of the optical element) the possibility of such a tilting compensation may also be absent. In such cases for example all four first flexures can be executed as (transversely to the bending axis short) pure rotating joints. In this case the restriction of the motion of the optical element 106.1 in relation to the external ring takes place in two degrees of freedom (namely translation in the x direction and rotation around the X direction).

Figure 8:
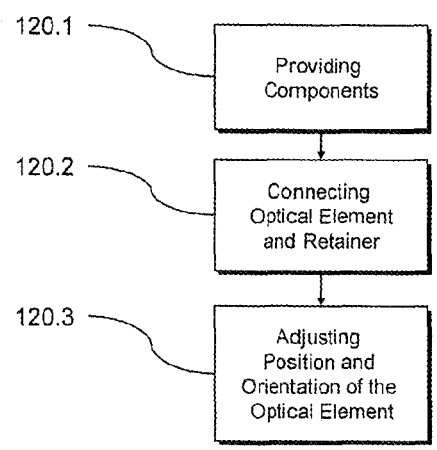
FIG. 8 is a block diagram of a preferred embodiment of the method according to the disclosure for supporting an optical element, which can be carried out with the optical imaging device of FIG. 1.

FIG. 8 shows a flow diagram of a preferred variant of a method according to the disclosure for supporting the optical element 106.1 which is carried out with the microlithography device 101.

Initially in a step 120.1 the components of the optical module 108 are made available as they have been described above.

In a step 120.2 the optical element 106.1 and the retaining device 109 are then connected together.

Then in a step 120.3 via the adjusting devices 116 the position and the orientation of the optical element are set in the manner described above.

Second Embodiment

In the following, with reference to FIGS. 1, 2 and 9A a further preferred embodiment of the support element 211 according to the disclosure is described. The support element 211 can be used in place of the support element 111 in the imaging device 101. The basic structure of the support element 211 and its method of operation correspond to the support element 111 from FIG. 2, so that here only the differences will be covered. In particular similar components are given a reference increased by a value of 100. Unless otherwise stated in the following, regarding the characteristics of the components express reference is made to the explanations given above.

Figure 9A:
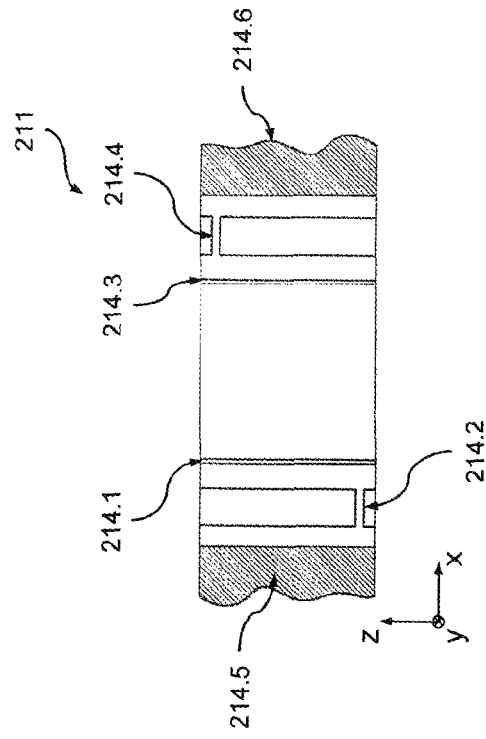
FIG. 9A to 9D are schematic cross-sectional views of part of further preferred embodiments of the support element according to the disclosure which can be used in the optical module of FIG. 2.

FIG. 9A shows a cross-section in the region of the support member 214. The only difference between the support element 211 and the support element 111 is that the first flexures 214.2 and 214.4 of the support element 214 are configured as leaf spring elements running transversely to the x direction. In this way likewise a restriction of motion in precisely one degree of freedom (namely rotation around the x axis) is brought about, so that here also a statically determined support of the optical element 106.1 is achieved.

Figure 9B:
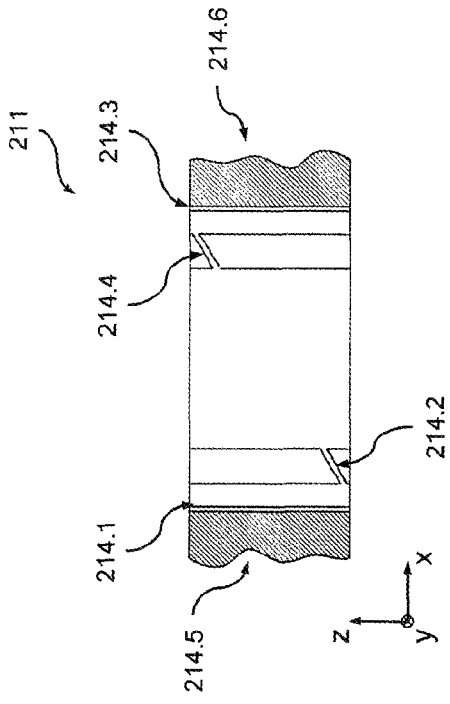
Figure 9C:
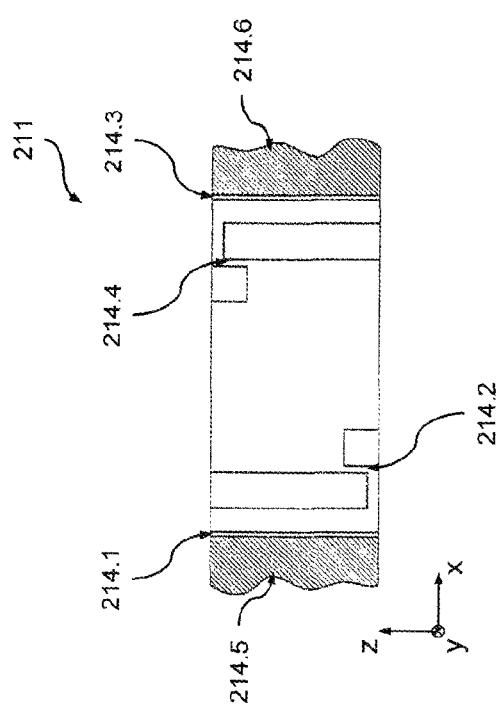
Figure 9D:
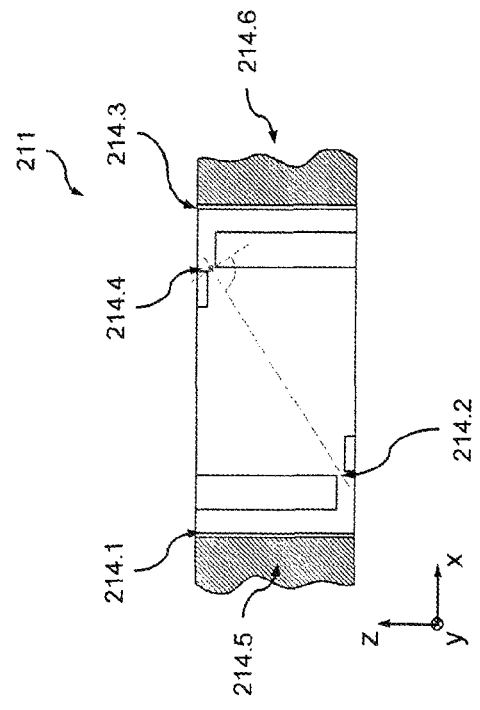

FIGS. 9B to 9D show further variants of the arrangement and configuration of the first flexures 214.1 to 214.4. Here it is self-evident that the configuration and arrangement of the flexures 214.1 to 214.4 can basically be selected in an arbitrary way. Thus, for example FIG. 9B shows a modification to the arrangement of the first embodiment in which the flexures 214.1 to 214.4 have an exchanged sequence in the direction of the force flow.

The arrangement of the flexures here is, as a rule, dependent upon the desired kinematics or conditions unrelated to rigidity, such as the ability to be produced and/or assembled. In particular the motion transmission ratio between the displacement in the first connection region 214.5 and the second connection region 214.6 is dependent upon the spacing of the two first flexures 214.2 and 214.4.

FIG. 9C shows a variant already described above in connection with the first embodiment, in which all flexures are executed as joints being short transverse to the bending axis and thus executed as rotating joints.

In the variant from FIG. 9D the two leaf-spring-like flexures 214.2 and 214.4 are aligned in the direction of force flow K. As a result their bending axes are thus arranged to be coplanar with the direction of force flow K. The same applies in other respects to the configuration from FIG. 9C. In this way, eventually, a desired distribution or setting of the kind of stresses arising under load (for example a reduction in the bending stresses, occurrence of purely tensile/compressive stresses) is obtained.

In an optical module 108 according to the embodiments described here the bipod braces can be arranged in their longitudinal direction parallel to a surface of the support unit, wherein the brace feet and the brace heads of the bipod braces are in each case by at least one flexure 214.2, 214.4 diametrically joined together such that their connecting line intersects the surface of the supporting unit at an angle.

Third Embodiment

In the following with reference to FIGS. 1, 2 and 10A a further preferred embodiment of the support element 311 according to the disclosure is described. The support element 311 can be used in place of the support element 111 in the imaging device 101. The basic structure of the support element 311 and its method of operation correspond to the support element 111 from FIG. 2, so that here only the differences will be covered. In particular similar components will be given a reference increased by a value of 200. Unless otherwise stated in the following, regarding the characteristics of the components express reference is made to the explanations given above.

Figure 10A:
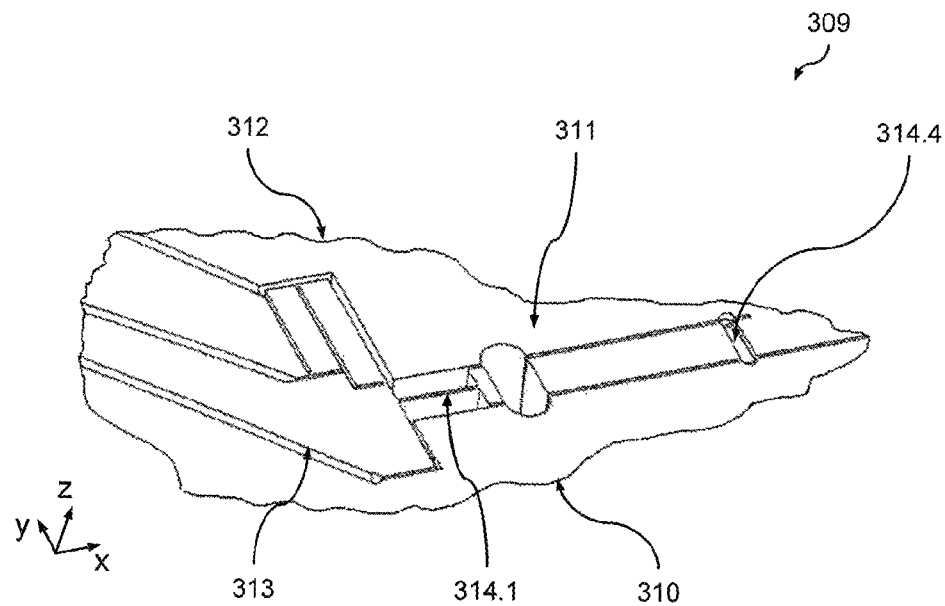
FIGS. 10A and 10B are schematic perspective views of part of further preferred embodiments of the support element according to the disclosure, which can be used in the optical module of FIG. 2.

FIG. 10A shows a cross-section in the region of the support member 314. The only difference between the support element 311 and the support element 111 is that the first flexure 314.1 of the support element 314 is configured as a leaf spring element (running in the x direction), while a flexure similar to the flexure 114.3 has been omitted. In other words, here the flexure 314.1 integrates firstly the function of the two bending elements 114.1 and 114.3 and also provides via its torsion a decoupling of tilting motions of the optical element 106.1 (around a tilting axis running transversely to the optical axis). In this way likewise a restriction of motion in precisely one degree of freedom is brought about (namely rotation around the x axis), so that here also a statically determined support of the optical element 106.1 is achieved.

Figure 10B:
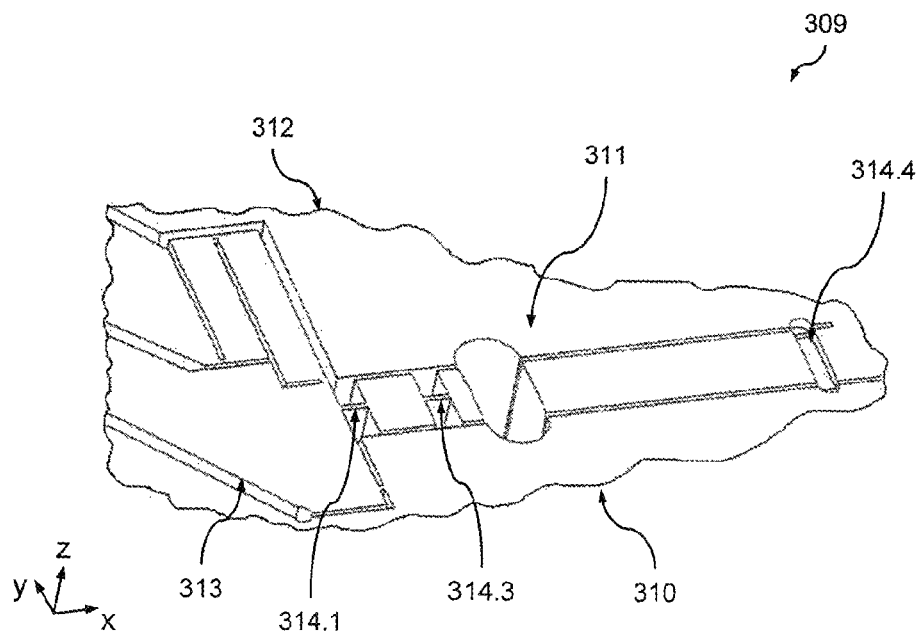
Figure 11A:
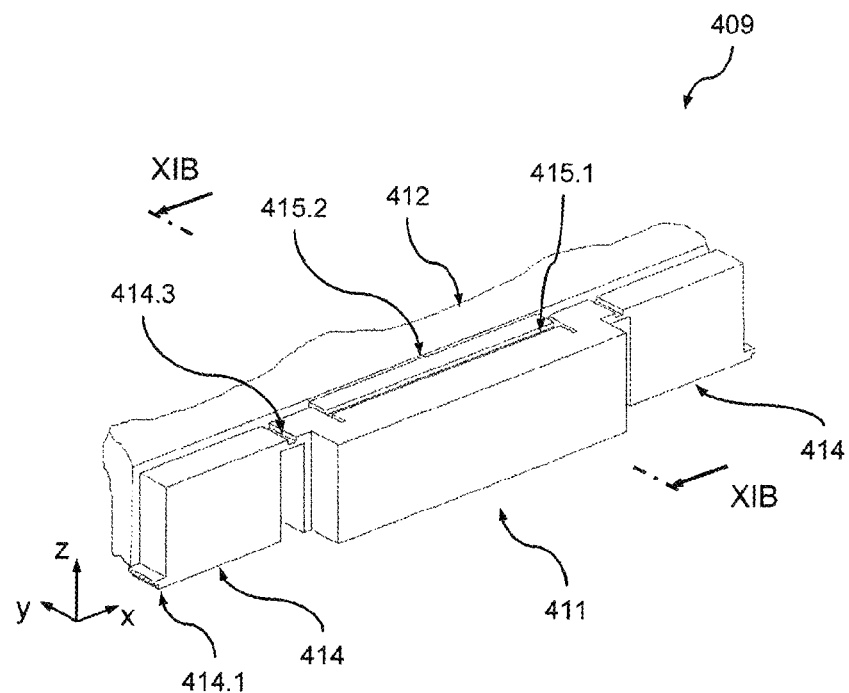
FIG. 11A is a schematic perspective view of part of a further preferred embodiment of the support element according to the disclosure, which can be used in the optical module of FIG. 2.
Figure 11B:
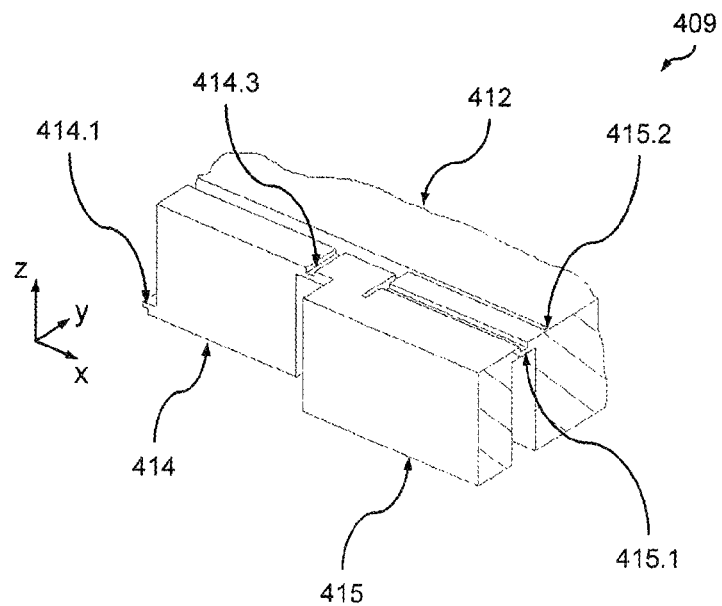
FIG. 11B is a schematic perspective sectional view of the support element of FIG. 11A (along line XIB-XIB of FIG. 11A)
Figure 12:
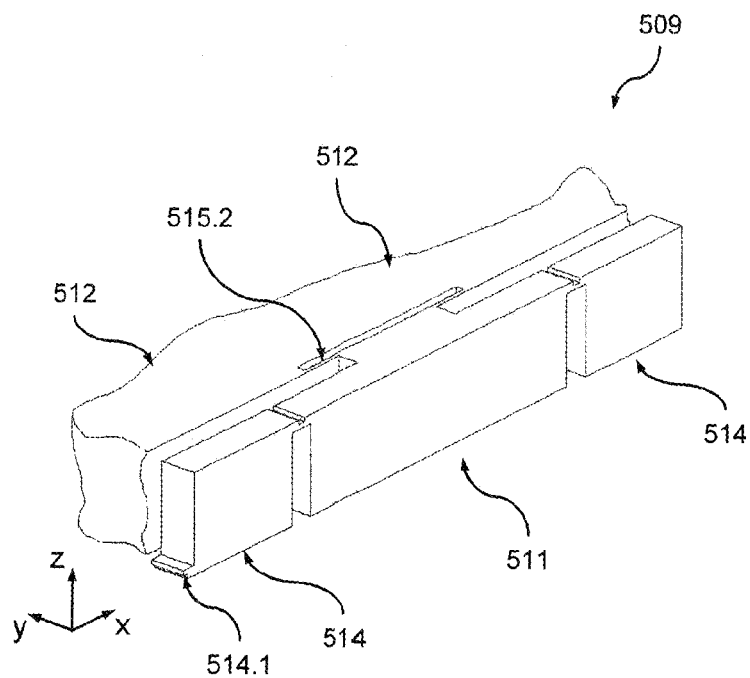
FIG. 12 is a schematic perspective view of part of a further preferred embodiment of the support element according to the disclosure, which can be used in the optical module of FIG. 2.

FIG. 10B shows a configuration that is similar in configuration and function to the configuration from FIG. 10A, in which instead of a long leaf spring two short leaf springs 314.1 and 314.3 are arranged immediately adjacent to one another.

Fourth Embodiment

In the following with reference to FIGS. 1, 2, 11A and 11B a further preferred embodiment of the support element 411 according to the disclosure is described. The support element 411 can be used in place of the support element 111 in the imaging device 101. The basic structure of the support element 311 and its method of operation correspond to the support element 111 from FIG. 2, so that here only the differences will be covered. In particular similar components will be given a reference increased by a value of 300. Unless otherwise stated in the following, regarding the characteristics of the components express reference is made to the explanations given above.

In this configuration the support member 414 merely has the two first flexures 414.1 and 414.3 (the bending axes of which run parallel to the y direction), so that in the region of the support member 414 a restriction of motion in four degrees of freedom takes place. The decoupling in two further degrees of freedom takes place in this variant in the region of the second connection element 415. To this end two second flexures 415.1 and 415.2 of the second connection element 415 again elongated along their bending axes are provided.

Whereas the flexure 415.1 decouples tilting motions of the optical element 106.1 around a tilting axis running transversely to the optical axis, the flexure 415.2 provides a decoupling of rotating motions of the optical element around its optical axis.

This configuration has the advantage that the decoupling of the tilting and rotating motions of the optical element 106.1 takes place in the immediate vicinity of the optical element 106.1, so that any deviations resulting therefrom in the position of the optical element from its setpoint value are less than for an arrangement of the decoupling elements far remote from the optical element 106.1 in the direction of the flow of force.

The embodiments of the optical module 108 described here can, similarly to the fourth embodiment, include at least one joint unit, which connects a brace head of a bipod brace directly or indirectly to the optical element, wherein the joint unit includes at least one flexure 414.3, the bending plane of which is parallel to the bipod plane of the corresponding bipod. Furthermore, in an optical module 108 alternatively or additionally a joint unit for connecting the optical element can include at least one flexure whose bending plane is perpendicular to the bipod plane of the corresponding bipod.

In further embodiments of the optical module 108 described here the brace heads of the bipod can be connected via the joint unit for connecting the optical element with a retaining element 112 retaining the optical element in each case via a connecting element 415. Here the retaining element 112 or the connecting element 415 can include at least a further flexure 415.1, 415.2. In so doing the further flexure 415.1, 415.2 can have a bending plane that is perpendicular to the bipod plane in the direction of an optical axis of the optical element, and/or which is perpendicular to the bipod plane in the direction perpendicular to an optical axis of the optical element.

Fifth and Sixth Embodiment

In the following with reference to FIGS. 1, 2, 12 and 13 further preferred embodiments of the support element according to the disclosure 511 and 611 are described. The support elements 511 of 611 can be used instead of the support element 411 in the imaging device 101. The basic structure of the support element 511 and 611 and its method of operation correspond to the support element 411 from FIG. 11A, so that here only the differences will be covered. In particular similar components will be given a reference increased by a value of 100 or 200. Unless otherwise stated in the following, regarding the characteristics of the components express reference is made to the explanations given above.

The difference between the support element 511 and the support element 411 is that via a leaf-spring-like second flexure 515.1 a decoupling in three degrees of freedom is provided, namely apart from the decoupling of the tilting and rotation motions of the optical element 106.1 also a decoupling of radial motions of the optical element 106.1 (thus motions in its radial direction).

In this configuration therefore the support member 514 and the second connection element 515 provide a restriction of motion of the optical element 106.1 in relation to the external ring 110 in precisely one degree of freedom (namely the translation in the x direction).

Figure 13:
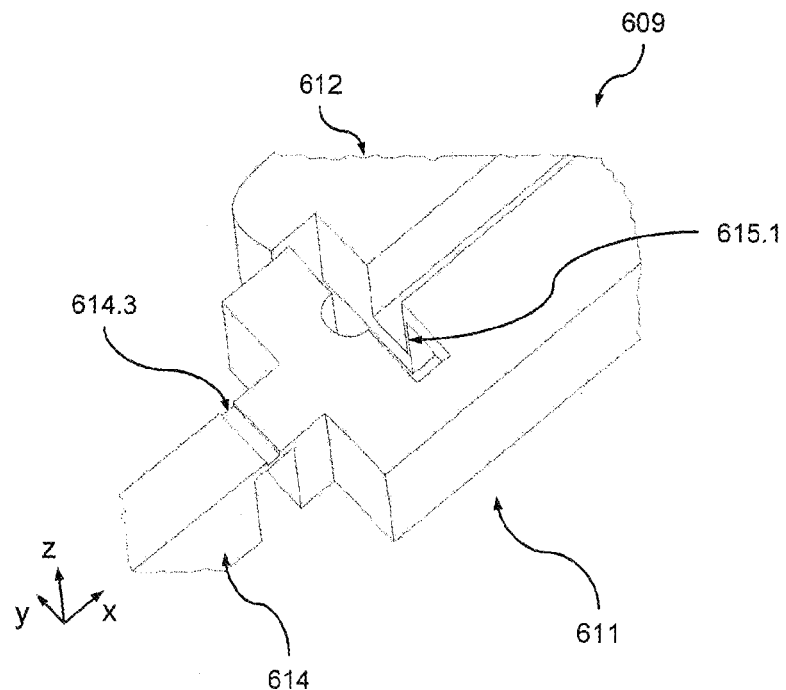
FIG. 13 is a schematic perspective view of part of a further preferred embodiment of the support element according to the disclosure, which can be used in the optical module of FIG. 2.

A similar restriction of motion results with the support element 611 from FIG. 13, wherein the leaf spring 615.1 regarding the decoupling of rotation motions of the optical element 106.1 is more rigid around its optical axis.

Seventh Embodiment

Figure 14A:
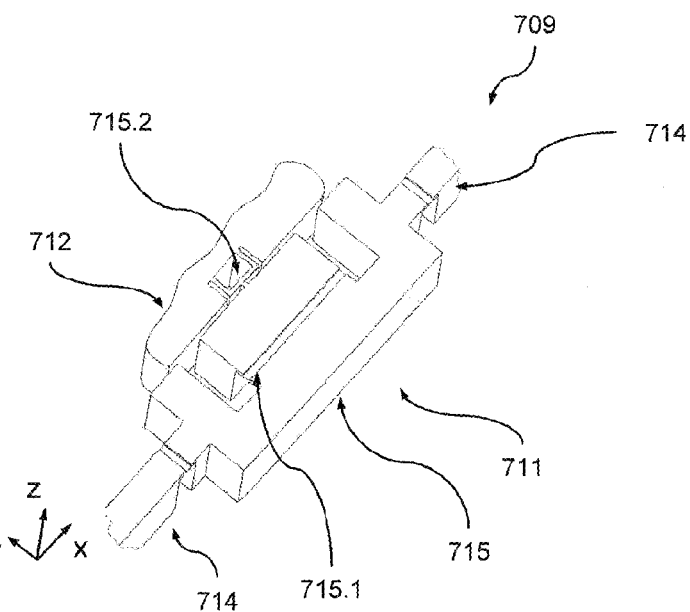
FIG. 14A to 14E are schematic cross-sectional views of part of a further preferred embodiment of the support element according to the disclosure which can be used in the optical module of FIG. 2.

In the following with reference to FIGS. 1, 2 and 14A a further preferred embodiment of the support element 711 according to the disclosure is described. The support element 711 can be used instead of the support element in the imaging device 101. The basic structure of the support element 711 and its method of operation correspond to the support element 411 from FIG. 11A, so that here only the differences will be covered. In particular similar components will be given a reference increased by a value of 300. Unless otherwise stated in the following, regarding the characteristics of the components express reference is made to the explanations given above.

The difference between the support element 711 and the support element 411 is that via an L-shaped leaf-spring-like second flexure 715.1 a decoupling in three degrees of freedom is provided, namely apart from the decoupling of the tilting and rotating motions of the optical element 106.1 also a decoupling of radial motions of the optical element 106.1 (thus motions in its radial direction) occurs.

Figure 14B:
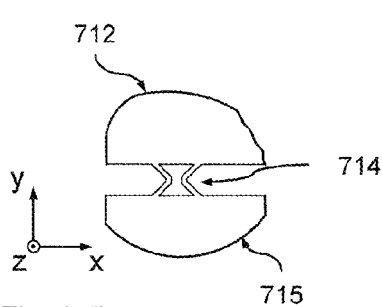
Figure 14C:
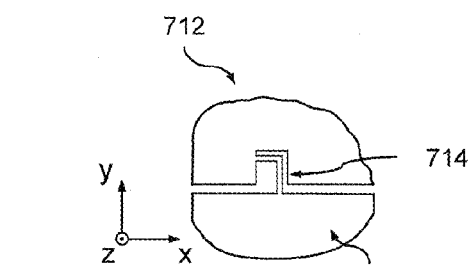
Figure 14D:
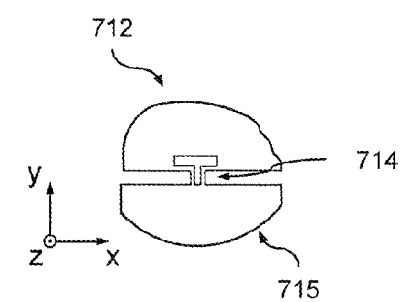

FIGS. 14B to 14D show further variants of the configuration of this flexure 715.2, wherein in each case the angled course of the cross-section of the flexure 715.2 in a cutting plane perpendicular to the bending axis is the decisive characteristic ensuring multiple decoupling.

Figure 14E:
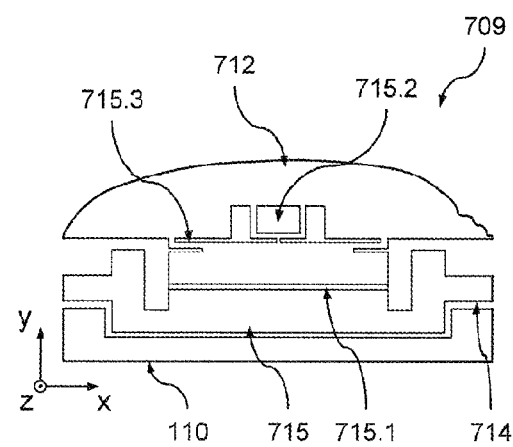

In FIG. 14E a further variant is shown, with which the problem of possible parasitic motions of the optical element in the x direction can be solved via additional leaf spring elements 715.3.

Eighth Embodiment

In the following with reference to FIGS. 1, 2, 15A a further preferred embodiment of the support element 811 according to the disclosure is described. The support element 811 can be used in place of the support element 111 in the imaging device 101. The basic structure of the support element 811 and its method of operation correspond to the support element 111 from FIG. 2, so that here only the differences will be covered. In particular similar components will be given a reference increased by a value of 700. Unless otherwise stated in the following, regarding the characteristics of the components express reference is made to the explanations given above.

The difference from the support element 111 here is merely in the configuration of the second flexure 813.1 via which the lever 813 is connected to the external ring 110. In the present example in order to improve the tilting support of the lever 813 the flexure 813.1 is formed by two leaf-spring-like elements, the axes of which intersect and thus define the instantaneous centre of rotation of the rotation motion of the lever 813.

Figures 15A, 15B:
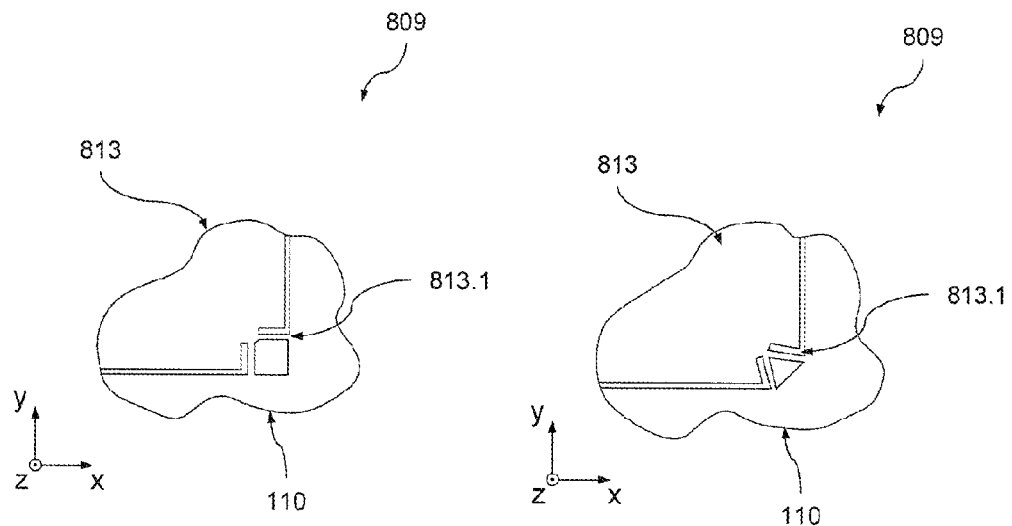
FIG. 15A to 15D are schematic cross-sectional views of part of a further preferred embodiment of the support element according to the disclosure which can be used in the optical module of FIG. 2.
Figures 15C, 15D:
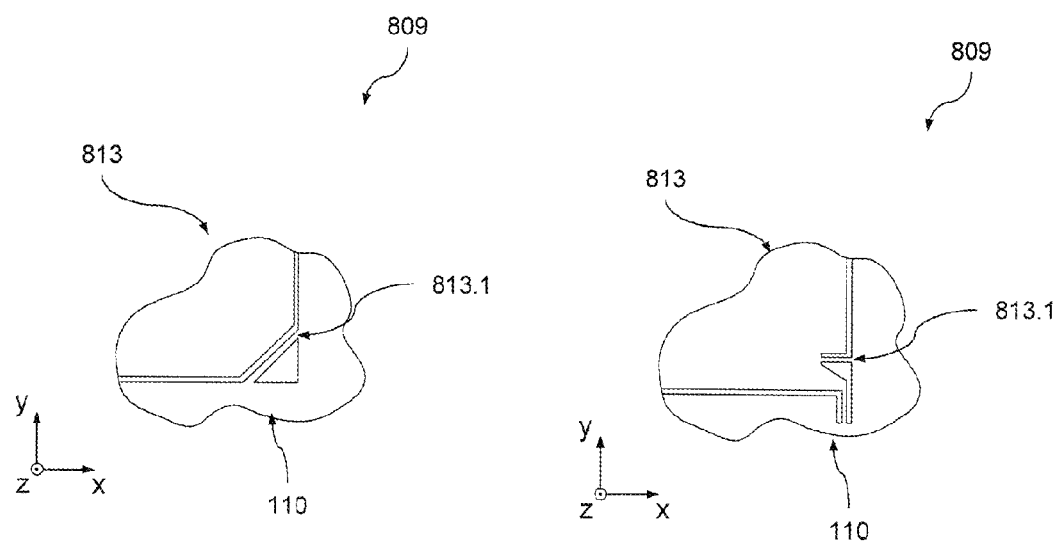

FIGS. 15B to 15D show further variants of this configuration with a different arrangement of the two leaf-spring-like elements configuring the flexure 813.1.

In further embodiments of the optical module 108 described here the flexure 813.1 of the bearing may include a plurality of flexures with in each case parallel bending planes, configuring a centre of rotation. Here preference is for the bending elements configuring the centre of rotation to be configured rigidly perpendicularly to their respective bending planes.

Ninth Embodiment

Figure 16:
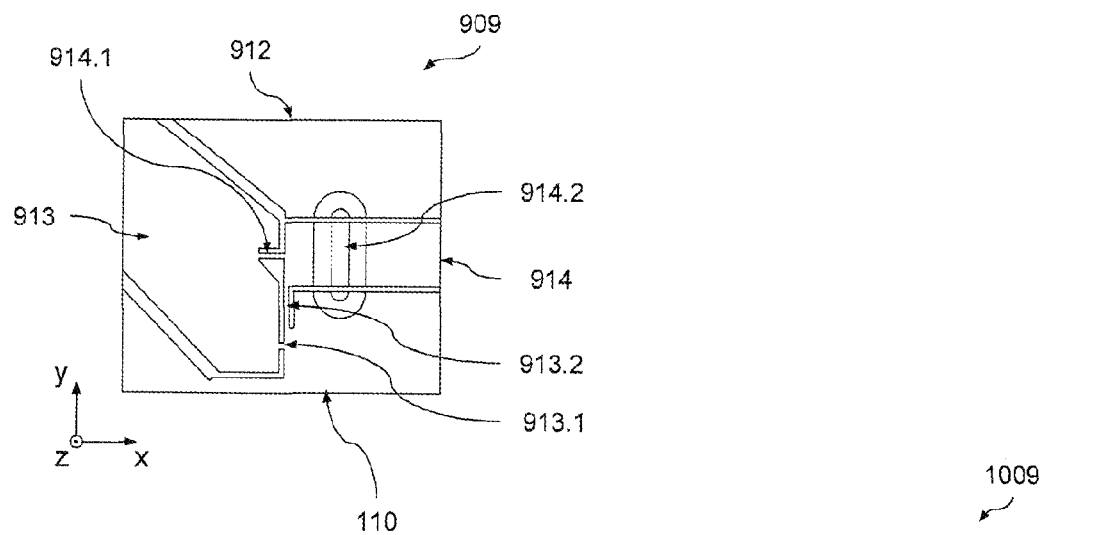
FIG. 16 is a schematic cross-sectional view of part of a further preferred embodiment of the support element according to the disclosure which can be used in the optical module of FIG. 2.

In the following with reference to FIGS. 1, 2, 16 a further preferred embodiment of the support element 911 according to the disclosure is described. The support element 911 can be used in place of the support element 111 in the imaging device 101. The basic structure of the support element 911 and its method of operation correspond to the support element 111 from FIG. 2, so that here only the differences will be covered. In particular similar components will be given a reference increased by a value of 800. Unless otherwise stated in the following, regarding the characteristics of the components express reference is made to the explanations given above.

The difference from the support element 111 here is in the configuration of the additional tilting support of the lever 913. In the present example the lever 913 is not directly additionally supported, rather an additional leaf-spring-like configuration flexure 913.2 is provided for, via which the support member 914 (in the direction of the z axis) is also supported, in order to avoid tilting of the lever 913 and as a result of the support member 114 (around the x axis).

A further difference is that the first flexure 914.1 likewise has a leaf-spring-like configuration. The axes of the leaf-spring-like flexures 914.1 and 913 intersect so that in this way the instantaneous centre of rotation of the compensation motion between the lever 913 and in the support member 914 is defined for a rotational motion of the lever 913.

Tenth Embodiment

In the following with reference to FIGS. 1, 2, 17A a further preferred embodiment of the support element 1011 according to the disclosure is described. The support element 1011 can be used in place of the support element 111 in the imaging device 101. The basic structure of the support element 1011 and its method of operation correspond to the support element 111 from FIG. 2, so that here only the differences will be covered. In particular similar components will be given a reference increased by a value of 900. Unless otherwise stated in the following, regarding the characteristics of the components express reference is made to the explanations given above.

The difference from the support element 111 is merely the configuration of the pre-tensioning device 1019, via which the lever 1013 is impinged upon with a pre-tension. In the present example the leaf spring 1019 is arranged in the region of the flexure 1013.1, via which the lever is joined to the external ring 110.

Figure 17A:
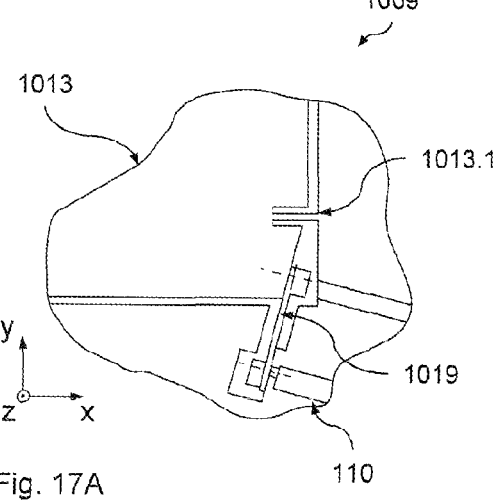
FIGS. 17B and 17B are schematic cross-sectional views of part of a further preferred embodiment of the support element according to the disclosure which can be used in the optical module of FIG. 2.
Figure 17B:
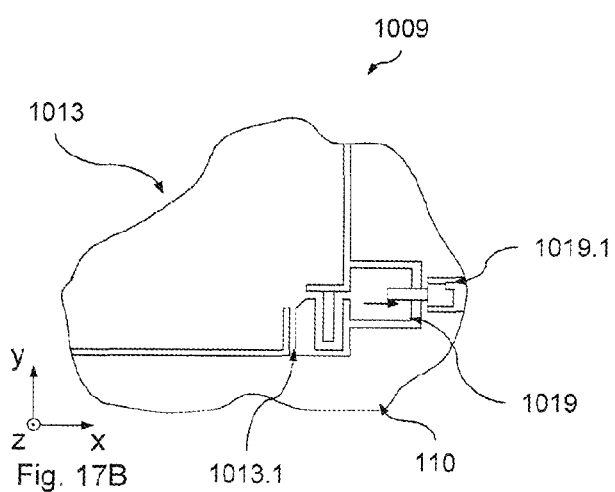

FIG. 17B shows a further variant of this configuration, in which the pre-tensioning device 1019 is integrated directly in the flexure 1013.1. To this end a leaf-spring-like element with a U-shaped cross-section (in the xy plane) is monolithically joined to the lever 1013. The pre-tensioning can be set via an adjusting screw 1019.1 (or a similar adjusting mechanism), which is joined to the external ring 110.

The present disclosure has been further described above exclusively using examples from the field of microlithography with light of a wavelength of 193 nm. It is self-evident, however, that the present disclosure can equally be used for any other applications or imaging methods, in particular at any wavelengths of the light used for imaging.

This application includes references included by citation and these form part of the application. In the event of an inconsistency between the express disclosure of the present application and a disclosure by a reference included by citation then the disclosure of the present application shall take precedence.

What is claimed is:

1. A support element for an optical element of a microlithography system, the support element comprising:
   a support member comprising a plurality of first flexures;
   a first connection element configured to connect the support member to an external support unit; and
   a second connection element configured to connect to the optical element, wherein:
the support element is configured to cooperate with further support elements in a parallel kinematic fashion to position and orient the optical element relative to the external support unit in six degrees of freedom;
the first connection element and/or the second connection element comprises a second flexure,
each of the first and second flexures defines a bending axis,
a motion restriction of the optical element relative to the external support unit is achievable in at most two degrees of freedom via the plurality of first and second flexures; and
each of the first and second flexures is configured in an elongated manner along the bending axis.

2. The support element of claim 1, wherein the motion restriction of the optical element relative to the external support unit is achievable in precisely one degree of freedom via the plurality of first and second flexures.

3. The support element of claim 1, wherein at least one of the first and second flexures is configured as a leaf spring.

4. The support element of claim 1, further comprising a support arrangement, wherein:
the support arrangement comprises the support member;
the support arrangement comprises a plurality of first and second flexures;
via the plurality of first and second flexures of the support arrangement, the motion restriction of the optical element relative to the support unit is achievable in at most two degrees of freedom; and
each of the first and second flexures of the support arrangement defines a bending axis and is configured in an elongated manner along the bending axis.

5. The support element of claim 4, wherein the support arrangement comprises at least three first and second flexures.

6. The support element of claim 5, wherein:
the support arrangement comprises precisely three first and second flexures; and
one of the first and second flexures is configured in an elongated manner transversely to its bending axis.

7. The support element of claim 5, wherein:
the support arrangement defines a force flow direction of the support force acting on the external support unit when supporting the optical unit;
two of the first and second flexures are configured so that their bending axes and the force flow direction are arranged to be substantially coplanar; and
the two flexures have a leaf-spring-like configuration.

8. The support element of claim 5, wherein:
the bending axes of at least two of the first and second flexures run substantially parallel to each other and
the bending axes of at least two of the first and second flexures run transversely to each other.

9. The support element of claim 1, wherein:
the support member has precisely two first flexures; and
the bending axes of the two first flexures of the support member run substantially parallel to one another.

10. The support element of claim 9, wherein:
the bending axes of the two first flexures of the support member run substantially parallel to one another; and
the bending axes of the two first flexures of the support member run transversely to the both the first and second directions.

11. The support element of claim 1, wherein:
the first connection element is configured to displace the second connection element in a first direction to exert a displacement in a second direction on the support member at its connection region to the first connection element; and
the first direction runs transversely to the second direction.

12. The support element of claim 1, wherein:
one of the first and second flexures has at least two legs configured in the form of a leaf spring and inclined to one another; and
the flexure in a sectional plane perpendicular to its bending axis has an L-shaped cross-section.

13. The support element of claim 1, wherein:
the first connection element is configured to displace the second connection element in a second direction to exert a displacement in a first direction on the support member at its connection region to the first connection element; and
the first connection element is connected via a second flexure to the external support unit.

14. The support element of claim 13, wherein:
the second flexure, via which the first connection element is connected to the external support unit, has at least two legs configured in the form of a leaf spring; and
each leg defines a main extension plane running parallel to the bending axis.

15. The support element of claim 13, wherein:
the second flexure, via which the first connection element is connected to the external support unit, defines an axis of rotation of the first connection element;
the first connection element and/or the support member is connected to the external support unit via a further second flexure; and
the further second flexure, in the direction of the axis of rotation, supports the first connection element on the external support unit.

16. The support element of claim 15, wherein:
the second flexure, by which the first connection element is connected to the external support unit, and the further second flexure are arranged opposite each other with regard to the connection of the support member to the first connection element; and
the further second flexure is arranged in the region of the connection of the support member to the first connection element.

17. The support element of claim 15, wherein the further second flexure has a leaf-spring-like configuration.

18. The support element of claim 17, wherein:
the second flexure, by which the first connection element is connected to the external support unit, defines an axis of rotation of the first connection element;
the first connection element is connected via a further second flexure with the external support unit; and
the further second flexure is configured to exert a pre-tensioning moment acting around the axis of rotation of the first connection element on the first connection element.

19. The support element of claim 18, wherein:
the further second flexure has at least one section configured in the form of a leaf spring;
the further second flexure defines a bending axis; and
the further second flexure has a section with an angled cross-section in a plane perpendicular to its bending axis.

20. The support element of claim 18, wherein:
the further second flexure is connectable via a pre-tensioning element with the external support unit; and via the pre-tensioning element, the pre-tensioning moment acting around the axis of rotation of the first connection element is adjustable.

21. An apparatus, comprising:
a support element according to claim 1,
wherein the apparatus is a microlithography apparatus.

22. The apparatus of claim 21, wherein the apparatus comprises an optical module comprising the support element.

23. The apparatus of claim 22, wherein the apparatus comprises an illumination system which comprises the optical module.

24. The apparatus of claim 22, wherein the apparatus comprises an objective which comprises the optical module.

25. A method, comprising:
supporting an optical element of a microlithography system via a plurality of support elements on an external support unit and positioning and orienting the optical element in a parallel kinematic fashion in relation to the external support unit in six degrees of freedom,
wherein:
- a support element has a support member which, via a first connection element, is connected to the external support unit and, via a second connection element, is connected to the optical element;
- the support member comprises a plurality of first flexures, and
- the first connection element and/or the second connection element has at least one second flexure,
- each of the first and second flexures defines a bending axis,
- via the plurality of first and second flexures a motion restriction of the optical element relative to the support unit is achievable in at most two degrees of freedom; and
- for each of the first and second flexures, a joint is used which is configured in elongated fashion along the bending axis.

26. The method of claim 25, wherein:
via the first connection element, a displacement in a second direction is exerted upon the support member at its connection to the first connection element in order to displace the second connection element in a first direction; and
the first direction runs transversely to the second direction.

27. The method of claim 25, wherein:
the first connection element, via a second flexure defining an axis of rotation of the first connection element, is connected to the external support unit;
the first connection element and/or the support member are connected, via a further second flexure, with the external support unit; and
the further second flexure, in the direction of the axis of rotation, supports the first connection element on the external support unit.

28. The method of claim 25, wherein:
the first connection element, via a second flexure defining an axis of rotation of the first connection element, is connected to the external support unit;
the first connection element is connected, via a further second flexure arranged next to the second flexure, with the external support unit; and
the further second flexure exerts a pre-tensioning moment on the first connection element acting around the axis of rotation of the first connection element.

29. The method of claim 28, wherein:
the further second flexure is connected via a pre-tensioning element with the external support unit; and
via the pre-tensioning element, the pre-tensioning moment acting around the axis of rotation of the first connection element is adjusted.

* * * * *

UNITED STATES PATENT AND TRADEMARK OFFICE
CERTIFICATE OF CORRECTION

PATENT NO. : 8,988,654 B2  
APPLICATION NO. : 13/071165  
DATED : March 24, 2015  
INVENTOR(S) : Jens Kugler, Ulrich Weber and Nicolai Wengert Page 1 of 1

It is certified that error appears in the above-identified patent and that said Letters Patent is hereby corrected as shown below:

In the Specification

Col. 5, line 56, delete the first occurrence of "FIGS. 17B" and insert -- FIGS. 17A --.

Col. 13, line 48, delete "the a" and insert -- the --.

Col. 16, line 32, delete "Embodiment" and insert -- Embodiments --.

Signed and Sealed this
Twenty-fifth Day of August, 2015

Michelle K. Lee
*Director of the United States Patent and Trademark Office*